June 21, 1960 W. MICHLIN 2,942,166

SEMICONDUCTOR APPARATUS

Filed March 23, 1959

INVENTOR.
WILLIAM MICHLIN

BY

Herbert Epstein

AGENT 2,942,166

SEMICONDUCTOR APPARATUS

William Michlin, Philadelphia, Pa., assignor to Philco Corporation, Philadelphia, Pa., a corporation of Pennsylvania Filed Mar. 23, 1959, Ser. No. 801,082

12 Claims. (Cl. 317—234)

Figure 1:
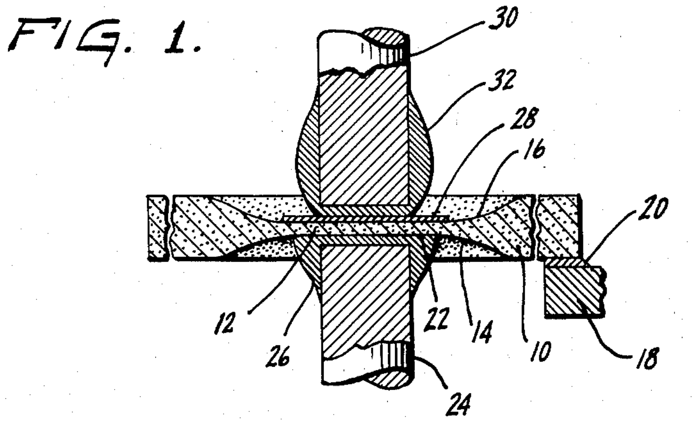

This invention relates to an improved rectifier electrode for a semiconductor device and to semiconductor devices employing such a rectifier electrode. More particularly it relates to an improved collector electrode for a transistor and to transistors employing such collector electrodes.

Heretofore the use of the transistor as a switching element in gating and multivibrator circuits of the saturating type has been limited to applications in which relatively slow switching speeds are tolerable. This limitation arises because a substantial time ordinarily is required to turn off the collector current of a saturated transistor. Specifically, the collector current of a saturated transistor cannot be turned off instantaneously because a substantial quantity of excess minority carriers normally accumulates in its base element during conduction, because these excess carriers must be drained from the base element before the collector current can stop flowing, and because such drainage takes an appreciable time. Moreover the greater the quantity of stored excess carriers, the longer is the time required to drain them from the base element.

Minority-carrier storage occurs in a saturated transistor in part because the emitter element injects minority carriers into its base element faster than the collector element can withdraw them therefrom. Also it occurs because the collector element of a typical prior-art transistor frequently is an excellent injector of minority carriers when forward-biased and because this electrode often becomes forward-biased in a transistor operating under saturating conditions. Under these conditions the collector element itself injects large quantities of excess minority carriers into the base element instead of collecting those minority carriers injected by the emitter element. As a result the time required to turn off the collector current of the transistor is substantially increased over that which would be required if the collector element did not inject minority carriers.

Accordingly, to reduce the minority-carrier-storage time of a transistor and thereby make it a faster switch, a collector element should be employed which is a poor minority-carrier injector. However efforts to fabricate such collector elements have heretofore produced transistors which exhibit excessively high reverse-saturation currents ($I_{co}$) and/or excessively low reverse diode breakdown voltages ($V_{CBO}$).

Accordingly an object of the invention is to provide an improved rectifier electrode for a semiconductor device, which is a poor minority-carrier injector but which has satisfactorily low reverse-saturation current and satisfactorily high reverse diode breakdown voltage.

Another object is to provide a transistor whose collector electrode exhibits poor injection efficiency, low reverse-saturation current and high diode breakdown voltage.

In accordance with the invention these objects are achieved by a novel rectifier electrode for a semiconductor device having a body composed of either n-type germanium or n-type silicon. This rectifier electrode comprises a layer of nickel coated onto a region of said body and a body of alloy melted onto said nickel layer and consisting essentially of tin, cadmium and indium. Preferably the indium content of the alloy is between about 0.5 and 1 percent by weight and in one specific embodiment the tin, cadmium and indium are present in the alloy in the respective concentrations of about 68, 31 and 1 percent by weight.

For reasons which are not well understood this rectifier electrode injects few minority-carriers even when strongly forward-biased but exhibits a satisfactorily low reverse-saturation current and satisfactorily high diode breakdown voltage. Accordingly the electrode is especially well suited for use as the collector electrode of high-speed switching transistors as well as in diodes utilizing majority-carrier conduction.

Other advantages and features of the invention will be apparent from a consideration of the following detailed description of a high-speed switching transistor of the microalloy type comprising as collector the rectifier electrode of the invention.

Figure 2:
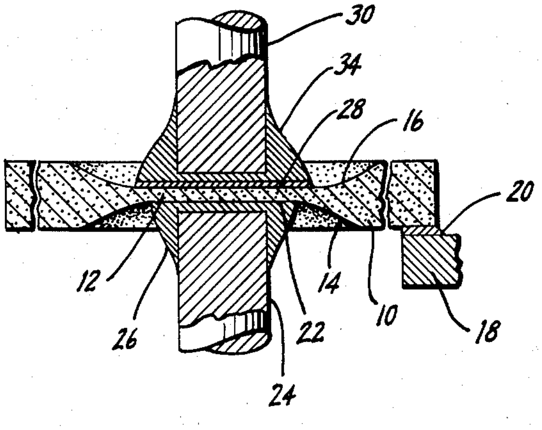

In the accompanying drawings Figure 1 is a diagrammatic representation, partially in cross-section, of a conventional microalloy transistor prior to the formation of the collector electrode according to the invention, and Figure 2 is a diagrammatic representation, partially in cross-section, of the same transistor after formation of this electrode.

The partially completed microalloy transistor shown in Figure 1 comprises a rectangular wafer 10 of n-type germanium typically having a resistivity of about 1.0 to 1.2 ohm-centimeters and a bulk hole lifetime of at least 100 millimicroseconds, a length of 115 mils, a width of 72 mils and a thickness of 4 mils. Wafer 10 has formed therein a thin base region 12, e.g. by electrolytically jet-etching it in a manner such as to produce opposed coaxial depressions whose respective surfaces 14 and 16 have substantially plane regions parallel to and spaced from one another by a very small distance, e.g. 0.15 mil. A base electrode 18, which typically is a nickel tab, is secured to one end of wafer 10 by a body of solder 20 (e.g. a tin-antimony alloy) producing a substantially ohmic contact. A highly efficient microalloy emitter element 22 is positioned just beneath (e.g. 0.01 mil beneath) the plane portion of surface 14. Preferably this emitter element is substantially planar and circular, having a diameter of about 5 mils and having been formed, for example, by the process described in copending patent application of Richard A. Williams, Serial No. 582,723, filed May 4, 1956, entitled "Method for Fabricating Semiconductive Device."

The collector electrode of the transistor described in the above-identified Williams application is typically of the surface-barrier type comprising a disk of indium plated onto the plane portion of surface 16 substantially coaxially with emitter element 22 and having a lead wire secured thereto with a cadmium-indium eutectic solder. Although the Williams transistor operates efficiently at high frequencies in a non-saturating circuit, appreciable time is required to turn off its collector current when it is employed as a switch in a saturating circuit. This is attributable in part to the fact that the indium surface-barrier collector electrode of the Williams transistor is a relatively efficient injector of minority carrier when forwardly-biased.

In accordance with the present invention the indium surface-barrier collector electrode is replaced by a collector electrode comprising a layer of nickel coated onto wafer 10 and an alloy composed essentially of tin, cadmium and indium melted over the nickel layer. Such a collector electrode is a poor injector of minority carriers, and as a result the time required to turn off the collector current of the transistor is substantially reduced. Nonetheless this collector electrode exhibits a satisfactory low reverse saturation current and a satisfactorily high diode breakdown voltage.

A preferred method of forming this novel collector electrode comprises the following steps: First a thin disk 28 of nickel is jet-electroplated onto a planar portion of surface 16, preferably coaxially with an indium disk (not shown) used to form the emitter element. In practice the nickel and indium disks are ordinarily plated concurrently onto surfaces 14 and 16 respectively. After the microalloy emitter element 22 has been formed, the end of a lead wire 30 having a globule 32 of tin-cadmium-indium solder electroplated thereon is abutted against nickel disk 28, preferably coaxially therewith. Globule 32 is then melted by heating it radiatively, or conductively via wire 30. Preferably the amount of heat is just sufficient to form a satisfactory solder bond between wire 30 and nickel disk 28. As a result, and as shown in Figure 2, a fillet 34 of the alloy forms between wire 30 and nickel disk 28. Thereafter the wafer is cleansed chemically and electrolytically in a manner described in detail hereafter.

In jet-electroplating nickel disk 28 onto surface 16 an electrolyte of the following composition has been found to be particularly satisfactory:

| | |
|---|---|
| $H_2O$, deionized | 1000 milliliters. |
| $NiSO_4 \cdot 7H_2O$ | 25 grams. |
| $NH_4Cl$ | 10 grams. |
| Polyoxyethylene ether (0.2% by volume aqueous solution) | 1 milliliter. |
| $NH_4OH$ | To establish pH of solution between 8 and 9. |

Typically this solution is directed in a jet about 5 mils in diameter against surface 16 and a plating current of about 0.8 milliampere is supplied thereto. After plating has been completed the unit is thoroughly rinsed in deionized water.

A lead wire 30 having on the end thereof a globule 32 of tin-cadmium-indium alloy may be formed using the process described and claimed in United tates Patent No. 2,818,375 granted December 31, 1957 to George L. Schnable. For this purpose an electrolytic solution having the following composition has been found satisfactory:

| | Grams |
|---|---|
| $CdCl_2$, anhydrous | 4 |
| $InCl_3$, anhydrous | 1 |
| $SnCl_2 \cdot 2H_2O$ | 7 |
| $NH_4Cl$ | 15 |
| Ethylenediamine tetraacetic acid | 10 |
| Glycerol | 150 |

In preparing this solution, the glycerol is heated to about 140° C. While the glycerol is maintained at that temperature the remaining constituents are added thereto and are dissolved therein by continuous stirring for about 2 hours.

A suitable quantity of the above-described solution is established at a temperature between about 135° C. and about 145° C. A few mils of wire 30 are then immersed therein, and a potential difference of about 20 volts is applied between the wire 30 and an inert anode, e.g. a carbon rod, also immersed therein. Under these conditions globule 32 of a ternary alloy composed of about 68 percent by weight of tin, about 31 percent by weight of cadmium and about 1 percent by weight of indium is deposited in molten form onto wire 30. Although the temperature of the plating bath is somewhat below the melting point (159° C.) of this ternary alloy the current density at wire 30 is sufficiently great to raise the temperature of the wire above the melting point of the alloy.

The wire is now ready to be bonded to nickel disk 28. As shown in Figure 1, globule 32 is abutted against nickel disk 28. Next globule 32 is melted in the manner described above and is then cooled, bonding wire 30 to nickel disk 28 by solder fillet 34.

The assembly is now cleansed as follows: First the assembly is rinsed in a deionized water. Then it is immersed for approximately 45 seconds in a solution consisting essentially of 3 parts by volume of glacial acetic acid, two parts by volume of concentrated nitric acid and two parts by volume of acetone. Thereafter the assembly is rinsed again in deonized water.

Next the surface of wafer 10 is electrolytically cleansed in accordance with the process taught in my copending patent application, Serial No. 685,536, filed September 23, 1957 and entitled "Electrochemical Method and Solution." In practicing this process an aqueous electrolytic etching solution is employed, preferably consisting of four molal potassium cyanide and one molal potassium hydroxide and maintained almost at its boiling point. A potential positive with respect to that of an inert anode, e.g. a carbon electrode, immersed in this solution is applied to lead wires 24 and 30 of the assembly to be cleansed, and the transistor is dipped several times into the solution to a depth sufficient to cover its emitter and collector electrodes. As a result of this treatment the reverse saturation current and diode breakdown voltage of the collector electrode are established at satisfactory values.

Subsequent to this electrolytic cleansing the unit is again rinsed in deionized water. Thereafter it is dipped in a solution consisting essentially of equal volumes of concentrated nitric and hydrofluoric acids. Finally it is soaked for 15 minutes in hot deionized water. Thereafter the unit can be packaged in conventional manner.

Transistors having the foregoing structure are found to exhibit hole storage times which are significantly lower than those found in prior-art transistors differing therefrom only in the structures of their collector electrodes. Thus, whereas the prior-art transistors exhibit hole storage times of the order of hundreds of millimicroseconds, the transistor of the invention exhibits hole storage times of the order of only tens of millimicroseconds.

Although in the preceding example the ternary alloy forming globule 32 has been specified as consisting essentially of about 68 percent tin, about 31 percent cadmium and about 1 percent indium, it is to be understood that the alloy need not have precisely this composition. However, best results are obtained by employing alloys having a relatively low indium concentration, e.g. about 0.5 to about 1 percent by weight.

Similarly the ternary alloy need not be used as a solder to secure a lead wire to nickel disk 28. On the contrary the results of the invention are achieved in a structure wherein the ternary alloy is merely melted onto the nickel disk.

Moreover while wafer 10 has been described above as being composed of *n*-type germanium, it may alternatively be composed of *n*-type silicon.

Furthermore while the specific example describes a microalloy transistor, the collector electrode of the invention is obviously usable in other types of transistors wherein reduction of minority-carrier storage time is desired.

In addition the rectifier electrode of the invention is by no means restricted to use as the collector electrode of a transistor. On the contrary it can be used in numerous other semiconductive devices requiring a rectifier electrode having simultaneously a low minority-carrier injection efficiency as well as satisfactorily low reverse-saturation current and satisfactorily high diode breakdown voltage. For example it can be used as the rectifier electrode of a majority-carrier conductive diode.

While I have described my invention by means of specific examples and in a specific embodiment, I do not wish to be limited thereto, for obvious modifications will occur to those skilled in the art without departing from the scope of my invention.

What I claim is:

1. A rectifier electrode for a semiconductor device having a body composed of a material selected from the group consisting of *n*-type germanium and *n*-type silicon, said rectifier electrode comprising a layer of nickel coated onto a region of said body and a body of alloy melted onto said nickel layer and consisting essentially of tin, cadmium and indium.

2. A rectifier electrode according to claim 1, wherein said body is composed of *n*-type germanium and the concentration of indium in said alloy lies in the range of about 0.5 to about 1 percent by weight.

3. A rectifier electrode according to claim 1, wherein said body is composed of *n*-type germanium and the respective concentrations of tin, cadmium and indium in said alloy are about 68, 31 and 1 percent by weight.

4. A semiconductor device having a body composed of a material selected from the group consisting of *n*-type germanium and *n*-type silicon, and a rectifier electrode comprising a layer of nickel coated onto a region of said body and a body of alloy melted onto said nickel layer and consisting essentially of tin, cadmium and indium.

5. A semiconductor device according to claim 4 wherein said body is composed of *n*-type germanium and the concentration of indium in said alloy lies in the range between about 0.5 and about 1 percent by weight.

6. A semiconductor device according to claim 4 wherein said body is composed of *n*-type germanium and the respective concentrations of tin, cadmium and indium in said alloy are about 68, 31 and 1 percent by weight.

7. A collector electrode for a transistor having a base element composed of a material selected from the group consisting of *n*-type germanium and *n*-type silicon, said collector electrode comprising a layer of nickel plated onto said base element and a body of alloy melted onto said nickel layer and consisting essentially of tin, cadmium and indium.

8. A collector electrode according to claim 7 wherein said material is *n*-type germanium and the concentration of indium in said alloy is between about 0.5 and about 1 percent by weight.

9. A collector electrode according to claim 7 wherein said material is *n*-type germanium and the respective concentrations of tin, cadmium and indium in said alloy are about 68, 31 and 1 percent by weight.

10. A transistor comprising a base element composed of *n*-type germanium and having a pair of substantially plane parallel surfaces, an emitter element positioned on one of said surfaces and a collector electrode positioned on the other of said surfaces substantially coaxially with said emitter element, said collector electrode comprising a layer of nickel plated onto said other surface and a body of alloy melted onto said nickel layer and consisting essentially of tin, cadmium and indium.

11. A transistor according to claim 10 wherein the concentration of indium in said alloy is between about 0.5 and about 1 percent by weight.

12. A transistor according to claim 10 wherein the respective concentrations of tin, cadmium and indium in said alloy are about 68, 31 and 1 percent by weight.

References Cited in the file of this patent

UNITED STATES PATENTS

| | | |
|---|---|---|
| 2,837,448 | Thurmond | June 3, 1958 |
| 2,885,608 | Bradley | May 5, 1959 |
| 2,907,935 | Nagorsen | Oct. 6, 1959 |